[19] United States Patent
Schmid et al.

[11] 4,218,418
[45] Aug. 19, 1980

[54] PROCESSES OF CASTING AN INGOT AND MAKING A SILICA CONTAINER

[75] Inventors: Frederick Schmid, Marblehead; Chandra P. Khattak, Peabody, both of Mass.

[73] Assignee: Crystal Systems, Inc., Salem, Mass.

[21] Appl. No.: 931,418

[22] Filed: Aug. 8, 1978

Related U.S. Application Data

[63] Continuation-in-part of Ser. No. 918,056, Jun. 22, 1978, abandoned.

[51] Int. Cl.² .................. C04B 33/34; C04B 35/52
[52] U.S. Cl. ................................. 264/299; 23/301; 264/60; 264/306; 264/308; 264/338
[58] Field of Search ............... 264/299, 306, 308, 338, 264/332, 30, 60; 23/301; 165/61

[56] References Cited

U.S. PATENT DOCUMENTS

| | | | |
|---|---|---|---|
| 3,116,137 | 12/1963 | Vasilos et al. | 264/332 |
| 3,653,432 | 4/1972 | Schmid et al. | 165/61 |
| 3,801,688 | 4/1974 | McGee | 264/332 |
| 3,836,613 | 9/1974 | Granitzki et al. | 264/30 |
| 3,837,630 | 9/1974 | Kohl et al. | 264/30 |
| 3,868,267 | 2/1975 | Gazza et al. | 264/60 |
| 3,898,051 | 8/1975 | Schmid | 165/61 |
| 4,107,392 | 8/1978 | Aoki et al. | 264/60 |

FOREIGN PATENT DOCUMENTS 590458 7/1947 United Kingdom .................. 264/332

Primary Examiner—Donald J. Arnold

[57] ABSTRACT

Ingots are cast in silica containers in which the interior surface of the container is defined by a thin skin of high density glass behind which the silica wall varies in density and cristobalite phase content.

21 Claims, 3 Drawing Figures

PROCESSES OF CASTING AN INGOT AND MAKING A SILICA CONTAINER

CROSS-REFERENCE TO RELATED APPLICATION

This application is a continuation-in-part of copending application Ser. No. 918,056, filed June 22, 1978 and now abandoned.

FIELD OF THE INVENTION

This invention relates to casting ingots in silica containers.

BACKGROUND OF THE INVENTION

In the unidirectional solidification or other casting of ingots of silicon and other materials, serious problems of cracking of the ingot result when the ingot forms a tenacious bond with the walls of the silica crucible and then contracts more rapidly during cooling than does the silica (due to mismatch of coefficients of thermal expansion). The ingot goes into tension and the crucible wall into compression; and the resulting stresses in the ingot are sufficient to crack it.

To some extent, the cracking, at least with the silicon ingots, has been solved by adding beryllium or aluminum to the silicon, or by using a crucible with a very thin (typically less than 0.5 mm thick) wall. The former technique, however, is not acceptable when high purity silicon ingots are required, as in semiconductor and photovoltaic applications; the latter is used only to cast small ingots.

SUMMARY OF THE INVENTION

It has been discovered that large crack-free ingots can be cast in silica containers in which the interior surface of the container is defined by a thin skin of high density glass behind which the silica wall varies in density and cristobalite phase content. The density and cristobalite phase are highest behind the glass and decrease toward the outside of the crucible.

In the preferred practice, the crucible is made by rapidly heating the inside surface of a sintered silica crucible to above its glass formation temperature and above the temperature at which cristobalite is formed, and then cooling; and the ingot is silicon or a silicon-containing material such as glass.

DESCRIPTION OF THE PREFERRED EMBODIMENT

Figure 1:
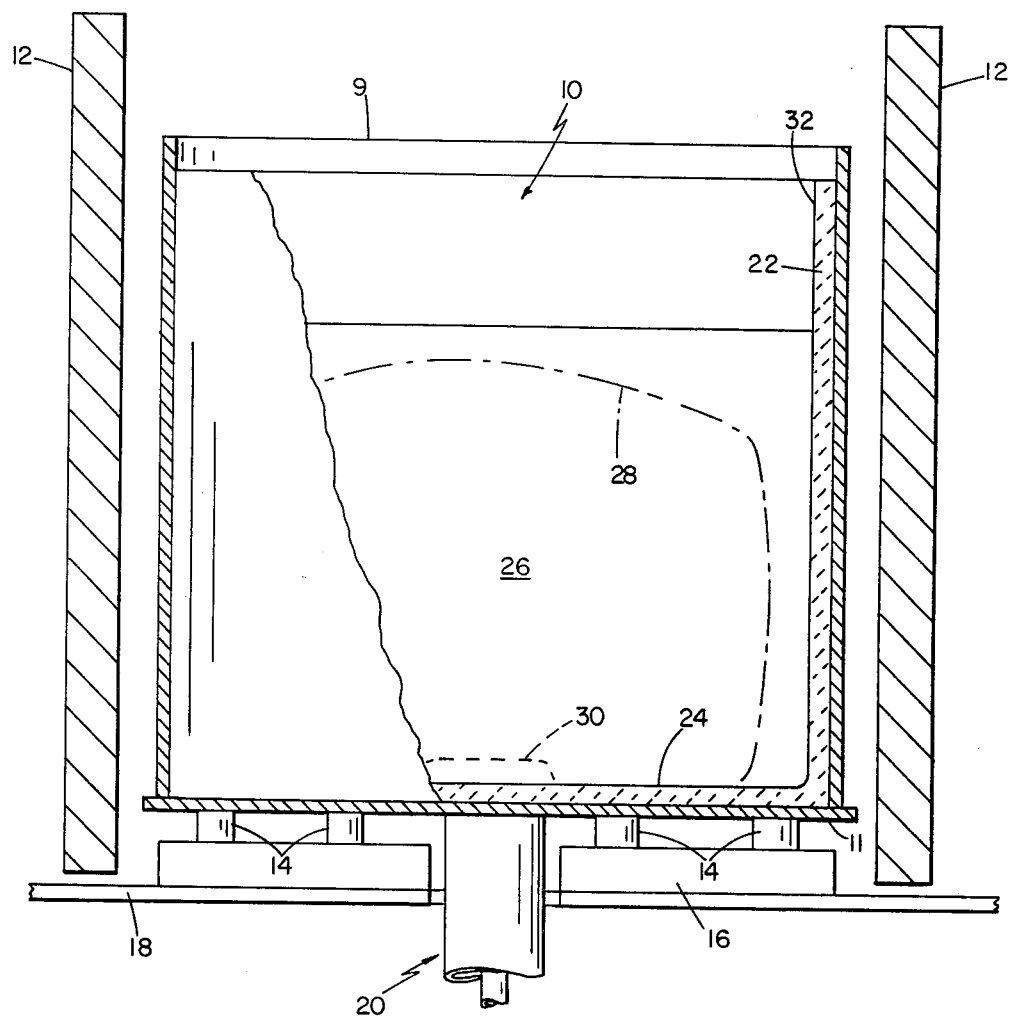
Figure 2:
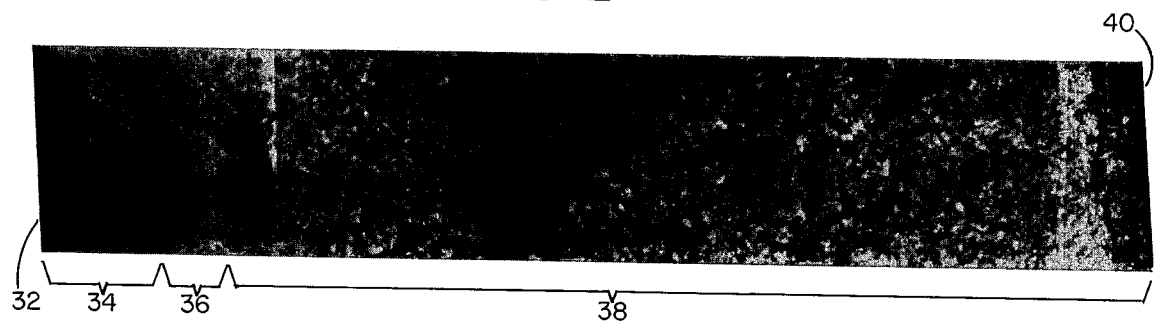
Figure 3:
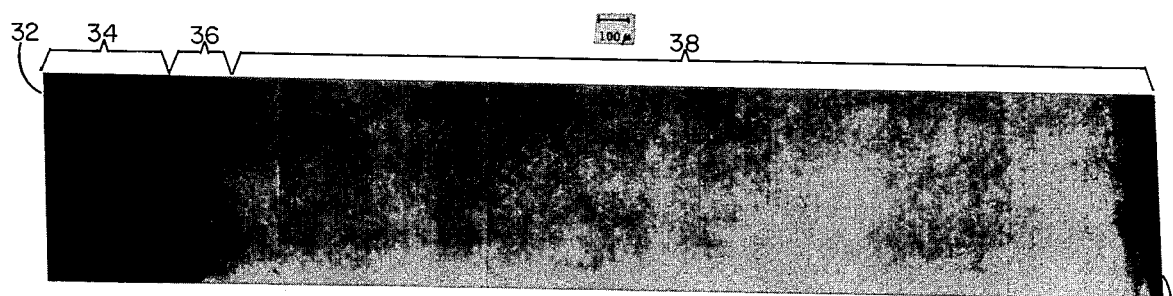

Objects, features and advantages of the invention will appear from the following detailed description of the structure, manufacture and use of a preferred crucible, taken together with the attached drawing in which:

FIG. 1 is a plan schematic, partially in section, of a crucible within the heating chamber of a casting furnace; and FIGS. 2 and 3 are photomicrographs of a portion of the wall of the crucible of FIG. 1.

Referring now to the drawings, FIG. 1 illustrates a silica crucible 10 within the cylindrical heating chamber defined by the resistance heater 12 of a casting furnace of the type disclosed in my U.S. Pat. No. 3,898,051, which is here incorporated by reference. The crucible 10 rests on a molybdenum disc 11 which itself is supported by graphite rods 14 mounted on a graphite support plate 16 on the bottom 18 of the heating chamber. A helium cooled molybdenum heat exchanger 20, of the type disclosed in my prior U.S. Pat. No. 3,653,432 which is here incorporated by reference, extends through openings in the center of the plate 16 and bottom 18 and engages the center of the disc 11.

Crucible 10 is about 6 in. (15 cm.) in height and diameter and its cylindrical wall 22 and base 24 are 0.15 in. (3.7 mm.) thick. Molybdenum disc 11 is about 0.040 in. (1 mm.) thick, and molybdenum retainer 9, comprising a sheet of the same thickness rolled into cylindrical form, snugly engages the exterior of cylinder wall 22. A silicon ingot 26, partially solidified according to the process described in aforementioned U.S. Pat. No. 3,898,051, is shown within the crucible. The solid-liquid interface 28 has advanced from the seed (shown in dashed lines at 30) so that there is a thin annulus of liquid between it and the crucible wall (the temperature of which is above the melting point of silicon), and also liquid above it. As discussed in detail in said aforementioned patents, the material to be solidified is melted in the crucible and the liquid is then solidified to form the ingot. When substantially all the liquid has been solidified, the temperature of the crucible wall will be permitted to drop below the silicon melting temperature, and the crucible and solidified ingot will then be cooled.

The solidified silicon ingot will form a tenacious bond with, but for reasons discussed hereafter will not penetrate into, the inside surface 32 of crucible wall 22. As the ingot and crucible cool, the ingot contracts more rapidly than does the crucible wall (due to the mismatch of coefficients of thermal expansion), and the bond between the two causes tension stresses (radially outwardly) in the ingot and compression stresses (circumferential ring stress) in the cylindrical crucible wall. To prevent cracking of the ingot, it is very important that the crucible relieve the stresses by failing. As described hereafter, the silica phase structure of crucible 10 is such that the crucible wall will be shattered, thereby resulting in a sound silicon ingot.

Reference is now made to FIGS. 2 and 3 which are photomicrographs, FIG. 3 being taken with polarized light, of a section through the wall 22 of crucible 10. The size of both is as indicated.

As shown, the cylindrical wall 22, and also the base 24, of silica crucible 10 is not of uniform phase composition through its thicknesses. At the inside surface 32 of wall 22, and at the top surface of base 24, is a thin glass skin 34. Behind skin 34, i.e., radially outward from the glass skin of wall 34 and below the glass skin of base 24, is a very thin region 36 of glass an cristobalite phase silica; and the rest of the crucible is a region 38 of cristobalite and unsintered vitreous silica. The density of the latter region varies, in both density and percentage of cristobalite phase silica. The density is greatest in the glass and glass-cristobalite regions. In the cristobalite-vitreous silica region 38, the crucible has a high percentage of cristobalite phase silicon (cristobalite density 2.33 g/cc) closest to glass skin 34 and the thin glass-cristobalite region; while adjacent the exterior 40 of the crucible there is more unsintered vitreous silica (vitreous silica density 2.2 g/cc). The transitions between the different regions are not sharp, and the region boundaries indicated in the drawings are necessarily somewhat approximate. The size of any particular region will vary from crucible to crucible, depending inter alia on the exact manner in which the crucible is formed; and the composition of different parts of the cristobalite-vitreous silica region 38 will vary also.

Crucible 10 is made by rapidly heating (by flame, electrode, arc or induction heating) the inside cylindrical surface and base of a slightly sintered (greenware) silica crucible to about 1770° C., above the 1725° C., glass formation and 1760° C. cristobalite cut-off temperatures of silica, thereby melting the silica particles adjacent the inside surface to form thin glass skin 34 and setting up a temperature gradient across the thickness of the wall. The heating is done quickly so that the glass skin 34 will not be too thick and only the silica closely adjacent the inside surface 32 of wall 22 and the top of base 24 becomes glass; and the crucible is then cooled. Rapid heating insures also a steep temperature gradient across the crucible, producing the desired structure. Directly behind glass skin 34, the maximum temperature reached will be between 1725° C. and 1760° C., resulting in the region 36 of both glass and cristobalite phase silica. Farther from skin 34, in region 38, the maximum temperature reached is less than 1725° C., no glass will be present. The percentage of cristobalite phase in region 38 will depend on the amount by and period of time during which the temperature exceeded 1000° C., the cristobalite formation temperature. If, as is sometimes the case, the temperature at the exterior 40 of the crucible did not reach 1000° C., the portion of region 38 adjacent the exterior will remain all unsintered vitreous silica. In any event, the percentage of cristobalite will be greatest adjacent the thin glass/cristobalite region 36 and will decrease away from the inside surface 32.

As the crucible cools, the melted silica at the inside of the crucible solidifies, forming glass skin 34. Skin 34 is generally less than 0.040 in. (1 mm.) thick, and, typically, has a thickness of about 0.010 in. (0.25 mm.) to about 0.020 in. (0.5 mm.). The silica in the thin glass/-cristobalite region 36 behind skin 34 has a tendency to devitrify, and internal stress may cause microcracking in this region. After cooling, the crucible is ready for use.

In use, chips of high purity silicon (with no additives other than dopants) are placed within crucible 10, melted, and then directionally solidified, according to the method described and claimed in my aforementioned U.S. Pat. No. 3,898,051. The silica glass skin 34 on the inside of wall 22 and top of base 24 is sufficiently dense that there is little or no penetration of molten silicon. But as is well known, the silicon ingot will stick to the inside surface 32 of the silica crucible. At temperatures above about 650° C., the silicon of the ingot will flow plastically and itself strain relieve stresses caused by the bond between the ingot and crucible wall. As the temperature continues to drop, however, the silicon ingot goes through the ductile-brittle transition temperature; and the silicon-silica interface stresses continue to develop. Cracking of the ingot is prevented, however, by controlled failure of the crucible. The microcracking and variation in phase composition behind the impervious glass skin 34 cause the interior surface of the crucible to delaminate. The thin glass skin 34 breaks, relieving the tension stresses in the ingot and preventing it from cracking; after the run, the crucible breaks in pieces.

OTHER EMBODIMENTS

The invention is useful in any process in which there are problems of bonding between an ingot and a silica container and resulting cracking of the ingot due to mismatch of thermal coefficients of expansion. Thus, the exact phase composition of the container used to cast the desired crack-free ingots may vary, as may the material being cast, the size and shape of the crucible, mold or other container, and the manner in which the crucibles or molds are made. In some processes, particularly where high purity is not important, it may be desirable to use commercially available crucibles, such as the translucent and opaque ware sold by Thermal Syndicate Ltd., Wallsend, Northumberland, England, rather than fabricating graded crucibles from greenware as above described. These and other embodiments are within the scope of the description and claims.

What is claimed is:

1. In the process of casting in a silica container an ingot of a material having a tendency to form a tenacious bond with the interior wall of the silica container, said process including the steps of first melting and thereafter solidifying said material to form said ingot, that improvement wherein said material is solidified in a silica container the wall of which comprises:

an interior surface defined by a thin glass skin; and, without said skin, silica varying in cristobalite phase silica content, said content being greater in a region near said skin than in a region more distant from said skin, whereby contracting of said ingot of said material within and bonded to said skin of said Container will break said skin rather than cracking the ingot.

2. The process of claim 1 wherein the percentage of cristobalite phase silica in said wall decreases generally according to the distance outward from said skin.

3. The process of claim 1 wherein the density of silica in said wall is greatest adjacent said interior surface.

4. The process of claim 1 wherein a thin region of said wall adjacent and without said skin comprises glass and cristobalite silica, and regions of said wall without said thin region comprise cristobalite and vitreous silica.

5. The process of claim 4 wherein said thin region is microcracked prior to solidifying said material in said container.

6. The process of claim 1 wherein said glass skin has a thickness less than about 0.40 in.

7. The process of claim 1 wherein the thickness of said skin is in the range of about 0.010 in. to about 0.020 in.

8. The process of claim 1 wherein said container is cylindrical and said interior surface is defined by the cylindrical wall and base of said container.

9. The process of claim 1 including the step of forming said container by heating the interior surface of a vitreous silica container to melt the silica defining said interior surface but not silica behind said interior surface; and thereafter cooling said container to cause said melted silica to form said glass skin.

10. The process of claim 9 wherein said interior surface is heated to a temperature above the glass formation and cristobalite phase cut-off temperatures of silica, and during said heating the temperature of silica without said interior surface remains below said cristobalite phase cut-off temperature.

11. The process of claim 10 wherein during said heating the temperature of silica in a first region without said interior surface remains below said cristobalite phase cut-off temperature, and the temperature of silica in a second region without said first region remains below said glass formation temperature.

12. The process of claim 11 wherein during said heating the temperature of silica adjacent the exterior surface of said container remains below the cristobalite formation temperature of silica.

13. In the process of making a container for use in casting ingots, that improvement comprising:

forming said container by heating the interior surface of the walls of a vitreous silica container to melt the silica defining said interior surface but not silica behind said interior surface; and thereafter cooling container to cause said melted silica to form a glass skin defining said interior surface and to form in regions without said skin silica varying in cristobalite phase silica content, said content being greater in a region nearer said skin than in a region more distant from said skin.

14. The process of claim 13 wherein said interior surface is heated to a temperature above the glass formation and cristobalite phase cut-off temperatures of silica, and during said heating the temperature of silica without said interior surface remains below said cristobalite phase cut-off temperature.

15. The process of claim 14 wherein during said heating the temperature of silica in a first region without said interior surface remains below said cristobalite phase cut-off temperature, and the temperature of silica in a second region without said first region remains below said glass formation temperature.

16. The process of claim 11 wherein during said heating the temperature of silica adjacent the exterior surface of said container remains below the cristobalite formation temperature of silica.

17. The process of claim 13 wherein said glass skin has a thickness in the range of about 0.010 in. to about 0.040 in.

18. The process of claim 13 wherein said container is cylindrical and interior surface is defined by the cylindrical wall and base of said container.

19. The process of claim 1 wherein said material is silicon.

20. The process of claim 1 wherein said material includes silicon.

21. The process of claim 20 wherein said material is glass.

* * * * *

UNITED STATES PATENT AND TRADEMARK OFFICE
CERTIFICATE OF CORRECTION

PATENT NO. : 4,218,418
DATED : August 19, 1980
INVENTOR(S) : Frederick Scnmid et al.

It is certified that error appears in the above—identified patent and that said Letters Patent is hereby corrected as shown below:

Column 1, before "Field of the Invention", please add the following paragraph:

---The invention described herein was made in the performance of work under NASA Contract Number NAS 7-100, JPL No. 954,373 and is subject to the provisions of Section 305 of the National Aeronautics and Space Act of 1958 (72 Stat. 435; 42 U.S.C. 2457).---

Signed and Sealed this

Tenth Day of March 1981

[SEAL]

Attest:

RENE D. TEGTMEYER

Attesting Officer     Acting Commissioner of Patents and Trademarks